(12) United States Patent
Terasawa

(10) Patent No.: US 8,669,825 B2
(45) Date of Patent: Mar. 11, 2014

(54) TEMPERATURE-COMPENSATED OSCILLATOR AND ELECTRONIC DEVICE

(75) Inventor: Katsuyoshi Terasawa, Shiojiri (JP)

(73) Assignee: Seiko Epson Corporation (JP)

( * ) Notice: Subject to any disclaimer, the term of this patent is extended or adjusted under 35 U.S.C. 154(b) by 24 days.

(21) Appl. No.: 13/446,245

(22) Filed: Apr. 13, 2012

(65) Prior Publication Data

US 2012/0262244 A1    Oct. 18, 2012

(30) Foreign Application Priority Data

Apr. 18, 2011 (JP) ................................. 2011-092444

(51) Int. Cl.
*H03L 1/00* (2006.01)
*H03B 5/30* (2006.01)

(52) U.S. Cl.
USPC ............ 331/176; 331/158; 331/186; 310/315; 310/346

(58) Field of Classification Search
USPC .......... 310/315, 346; 331/154, 156, 158, 176, 331/186
See application file for complete search history.

(56) References Cited

U.S. PATENT DOCUMENTS

| | | | | |
|---|---|---|---|---|
| 5,548,252 A | * | 8/1996 | Watanabe et al. | 331/176 |
| 5,668,506 A | * | 9/1997 | Watanabe et al. | 331/66 |
| 5,801,594 A | * | 9/1998 | Muto et al. | 331/158 |
| 5,874,864 A | * | 2/1999 | Muto et al. | 331/66 |
| 5,892,408 A | * | 4/1999 | Binder | 331/44 |
| 5,977,840 A | * | 11/1999 | Connell et al. | 331/158 |
| 6,292,066 B1 | * | 9/2001 | Shibuya et al. | 331/176 |
| 6,366,175 B2 | * | 4/2002 | Oka | 331/116 R |
| 6,771,135 B2 | * | 8/2004 | Kubo et al. | 331/66 |
| 6,882,835 B2 | * | 4/2005 | Oka et al. | 455/260 |
| 2011/0273333 A1 | * | 11/2011 | Terasawa et al. | 342/357.77 |
| 2012/0286890 A1 | * | 11/2012 | Terasawa | 331/176 |

FOREIGN PATENT DOCUMENTS

| | | |
|---|---|---|
| JP | 62-038605 | 2/1987 |
| JP | 2003-258551 | 9/2003 |
| JP | 2007-208584 | 8/2007 |

* cited by examiner

*Primary Examiner* — Levi Gannon
(74) *Attorney, Agent, or Firm* — Harness, Dickey & Pierce, P.L.C.

(57) ABSTRACT

A temperature-compensated oscillator includes a temperature compensation circuit adapted to output a temperature compensation voltage, a voltage-controlled oscillation circuit on which temperature compensation is performed based on the temperature compensation voltage, a switch circuit adapted to perform ON/OFF control on power supply to the temperature compensation circuit, and a sample-and-hold circuit adapted to perform switching control between an ON state of outputting the temperature compensation voltage to the voltage-controlled oscillation circuit while being connected to the temperature compensation circuit and holding the temperature compensation voltage output from the temperature compensation circuit when the power is supplied to the temperature compensation circuit, and an OFF state of outputting the temperature compensation voltage held to the voltage-controlled oscillation circuit while cutting connection to the temperature compensation circuit when the power supply to the temperature compensation circuit is cut.

8 Claims, 8 Drawing Sheets

TEMPERATURE-COMPENSATED OSCILLATOR AND ELECTRONIC DEVICE

BACKGROUND

1. Technical Field

The present invention relates to a temperature-compensated oscillator allowing reduction of power consumption while keeping the accurate temperature compensation, and an electronic device equipped with the temperature-compensated oscillator.

2. Related Art

In the past, a crystal oscillator such as a temperature-compensated crystal oscillator (TCXO), which is less susceptible to ambient temperature and inherent characteristics of electrical components, and is superior as a stable oscillation circuit, has been used as a reference clock source of an electronic device such as a microcomputer or a cellular phone.

FIG. 9 shows a temperature-compensated crystal oscillator described in JP-A-2003-258551 (Patent Document 1). As shown in FIG. 9, the temperature-compensated crystal oscillator 100 is composed of an oscillation circuit 102 and a temperature compensation circuit 106. The oscillation circuit 102 has a structure in which a plurality of series circuits each composed of a switch Sn (n denotes a natural number) and a capacitor Cn (n denotes a natural number) is connected to a circuit including a crystal vibrator 104 as an oscillation source, and by setting the switches Sn to ON/OFF, it is possible to vary the capacitance inside the oscillation circuit 102 to thereby control the oscillation frequency of the oscillation signal. On the other hand, the temperature compensation circuit 106 selects a correction value for controlling the frequency so as to reduce the variation in the oscillation frequency of the crystal vibrator 104 due to the temperature variation based on the temperature information obtained by a temperature sensor 108, and then outputs signals for switch control according to the correction value to the oscillation circuit 102. Further, it results that in the oscillation circuit 102, the switches S1, . . . , Sn are individually switched ON/OFF in accordance with the signals for switch control input thereto.

In the temperature-compensated crystal oscillator described in JP-A-62-38605 (Patent Document 2), although being composed of the oscillation circuit and the temperature compensation circuit, the oscillation circuit is provided with a varactor diode with a capacity varying in accordance with the voltage applied thereto, and the temperature compensation circuit outputs a control signal for controlling the capacitance value of the varactor diode so as to reduce the frequency variation of the crystal vibrator due to the temperature variation to thereby vary the frequency. Thus, the oscillation circuit applies the voltage corresponding to the control signal to the varactor diode.

Therefore, in the temperature-compensated crystal oscillator in Patent Document 1 or 2, it results that the frequency variation (an approximate value thereof in Patent Document 1) due to the capacitance inside the oscillation circuit has opposite temperature characteristics to the temperature characteristics of the deviation of the oscillation frequency of the crystal vibrator.

Therefore, the temperature-compensated crystal oscillator of Patent Document 1 or 2 is capable of reducing the variation in the temperature characteristics of the oscillation frequency of the crystal vibrator by the frequency variation due to the capacitance variation inside the oscillation circuit to thereby output the oscillation signal having temperature characteristics of low temperature dependency, a similar technology to which is also disclosed in JP-A-2007-208584 (Patent Document 3).

However, in the temperature-compensated crystal oscillator 100 of Patent Document 1, there are a problem that the frequency changes rapidly due to the change in the capacitance since the change in the capacitance is discrete, and a problem that the cost is too high since it is required to increase the number of capacitors Cn in order to improve the accuracy of the temperature compensation.

Further, the temperature-compensated crystal oscillator of Patent Document 2 has the configuration of driving the temperature compensation circuit if the frequency of the oscillation signal runs off a certain acceptable range centered on a reference frequency. However, since the frequency of the crystal oscillator is controlled using digital data, there is a problem that the frequency changes rapidly similarly to the case of Patent Document 1 on the ground, for example, that there exists a difference between the value to be compensated when resuming the temperature compensation and the compensation value by the digital data. Further, it is necessary to always drive the temperature compensation circuit without setting the acceptable range in order to perform more accurate temperature compensation, and on this occasion, there is a problem that the power consumption of the temperature compensation circuit increases.

SUMMARY

An advantage of some aspects of the invention is to provide a temperature-compensated oscillator allowing reduction of power consumption while keeping the accurate temperature compensation, and an electronic device equipped with the temperature-compensated oscillator.

APPLICATION EXAMPLE 1

This application example is directed to a temperature-compensated oscillator including a temperature compensation circuit adapted to output a temperature compensation voltage based on the temperature measured, and a voltage-controlled oscillation circuit adapted to perform temperature compensation of oscillation frequency based on the temperature compensation voltage, and further includes a switch circuit capable of performing ON/OFF control on power supply to the temperature compensation circuit, and a sample-and-hold circuit capable of performing switching control between an ON state of outputting the temperature compensation voltage to the voltage-controlled oscillation circuit while being connected to the temperature compensation circuit and holding the temperature compensation voltage output from the temperature compensation circuit when the power is supplied via the switch circuit, and an OFF state of outputting the temperature compensation voltage held to the voltage-controlled oscillation circuit while cutting connection to the temperature compensation circuit when the power supply is cut by the switching circuit.

According to the configuration described above, it is possible to switch between a state of outputting the temperature compensation voltage to the voltage-controlled oscillation circuit while driving the temperature compensation circuit and holding the temperature compensation voltage output from the temperature compensation circuit by the sample-and-hold circuit, and a state of stopping the drive of the temperature compensation circuit and outputting the temperature compensation voltage, which has already been held by the sample-and-hold circuit, to the voltage-controlled oscillation circuit. Therefore, the temperature-compensated oscillator reducing the power consumption can be obtained.

APPLICATION EXAMPLE 2

This application example is directed to the temperature-compensated oscillator according to Application Example 1, which further includes an output circuit adapted to output an ON/OFF signal for performing switching control between an ON state and an OFF state of the switch circuit, and an ON/OFF signal for performing the switching control of the sample-and-hold circuit.

According to the configuration described above, the ON/OFF control of the temperature compensation circuit and the switching control of the sample-and-hold circuit can be synchronized with each other.

APPLICATION EXAMPLE 3

This application example is directed to the temperature-compensated oscillator according to Application Example 2, wherein the output circuit includes an LC oscillation circuit as an oscillation source circuit of the ON/OFF signals.

According to the configuration described above, the ON/OFF control of the temperature compensation circuit and the switching control of the sample-and-hold circuit can be synchronized with each other at a predetermined period.

APPLICATION EXAMPLE 4

This application example is directed to the temperature-compensated oscillator according to Application Example 2, wherein an oscillation source circuit of the ON/OFF signal of the output circuit is the voltage-controlled oscillation circuit.

According to the configuration described above, the ON/OFF control of the temperature compensation circuit and the switching control of the sample-and-hold circuit can be synchronized with each other at a predetermined period without providing an additional oscillation circuit.

APPLICATION EXAMPLE 5

This application example is directed to the temperature-compensated oscillator according to any one of Application Examples 3 and 4, wherein the output circuit includes an integration circuit adapted to integrate an oscillation signal from the oscillation source circuit, and a comparator adapted to output a signal representing a magnitude relation between a voltage of a signal integrated and a threshold voltage to each of the switch circuit side and the sample-and-hold circuit side as the ON/OFF signal.

According to the configuration described above, it is possible to vary the duration time of the ON state and the duration time of the voltage of the OFF state of the temperature compensation circuit. In particular, by controlling the threshold voltage so that the duration time of the ON signal is shortened, the power consumption of the temperature compensation circuit can dramatically be reduced.

APPLICATION EXAMPLE 6

This application example is directed to the temperature-compensated oscillator according to Application Example 5, wherein the output circuit includes a voltage control section adapted to control the threshold voltage.

According to the configuration described above, the duration time in which the ON state is set can arbitrarily be controlled in accordance with the characteristics of the temperature compensation circuit.

APPLICATION EXAMPLE 7

This application example is directed to the temperature-compensated oscillator according to any one of Application Examples 5 and 6, wherein the output circuit includes a delay circuit to which an output signal of the comparator is input, and which outputs a delay signal obtained by delaying a voltage variation in the output signal of the comparator, an OR circuit adapted to output a signal representing an OR result between the ON/OFF signal and the delay signal to the switch circuit as the ON/OFF signal, and an AND circuit adapted to output a signal representing an AND result between the output signal of the comparator and the delay signal to the sample-and-hold circuit as the ON/OFF signal.

According to the configuration described above, the rising of the drive of the sample-and-hold circuit becomes later than the rising of the drive of the temperature compensation circuit, and the falling of the drive of the sample-and-hold circuit becomes earlier than the falling of the drive of the temperature compensation circuit. Therefore, since it is possible for the temperature compensation circuit to stabilize the output of the temperature compensation voltage in a period before the sample-and-hold circuit is started up, and the sample-and-hold circuit is halted before the temperature compensation circuit is stopped, it is possible to reliably hold the temperature compensation voltage output from the temperature compensation circuit.

APPLICATION EXAMPLE 8

This application example is directed to the temperature-compensated oscillator according to any one of Application Examples 1 through 7, which further includes a low-pass filter disposed at least one of between the temperature compensation circuit and the sample-and-hold circuit, and between the sample-and-hold circuit and the voltage-controlled oscillation circuit.

It results that the sample-and-hold circuit switches from the temperature compensation voltage held to the temperature compensation voltage newly input from the temperature compensation circuit immediately after setting the temperature compensation circuit to the ON state. Therefore, the temperature compensation voltage becomes discontinuous in the time direction at the switching, which might exert a harmful influence to the voltage-controlled oscillation circuit. Therefore, by adopting the configuration described above, it is possible to make the time variation in the temperature compensation voltage newly input thereto gentle to thereby reduce the load on the voltage-controlled oscillation circuit.

APPLICATION EXAMPLE 9

This application example is directed to an electronic device including the temperature-compensated oscillator according to any one of Application Examples 1 through 8.

According to the configuration described above, an electronic device allowing reduction of power consumption while keeping the accurate temperature compensation is realized.

BRIEF DESCRIPTION OF THE DRAWINGS

The invention will be described with reference to the accompanying drawings, wherein like numbers reference like elements.

FIGS. 7A and 7B are block diagrams of the temperature-compensated oscillator according to a second embodiment of the invention, wherein FIG. 7A is a diagram having a low-pass filter disposed between a temperature compensation circuit and a sample-and-hold circuit, and FIG. 7B is a diagram having a low-pass filter disposed between the sample-and-hold circuit and a voltage-controlled oscillation circuit.

DESCRIPTION OF EXEMPLARY EMBODIMENTS

Hereinafter, some embodiments of the invention shown in the accompanying drawings will be explained in detail. It should be noted that constituents, types, combinations, shapes, relative arrangements thereof, and so on described in the present embodiments are not intended to limit the scope of the invention only thereto and are nothing more than mere explanatory examples unless specifically described.

Figure 1:
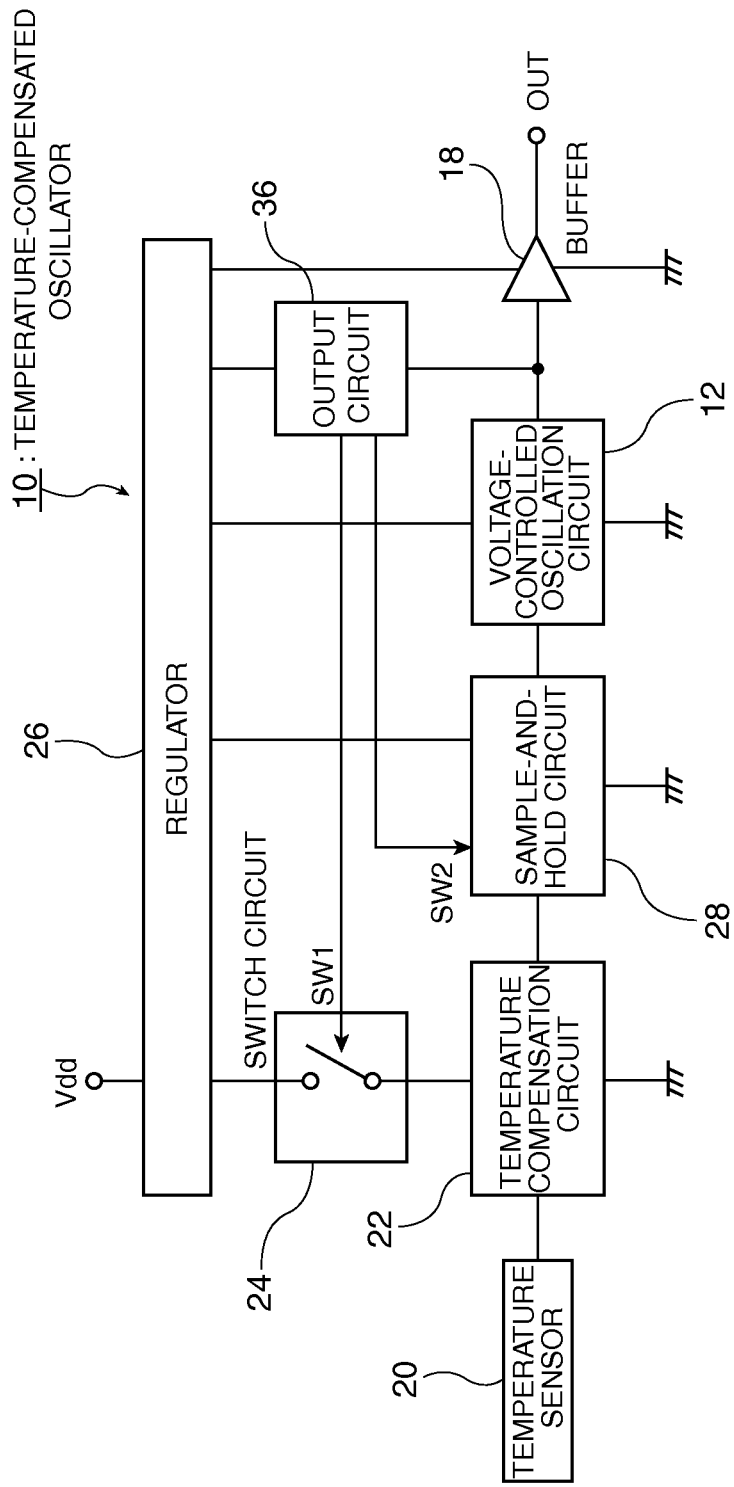
FIG. 1 is a general block diagram of a temperature-compensated oscillator according to a first embodiment of the invention.

FIG. 1 shows a general block diagram of a temperature-compensated oscillator according to a first embodiment. The temperature-compensated oscillator 10 according to the first embodiment has a configuration having a temperature sensor 20, a temperature compensation circuit 22, a sample-and-hold circuit 28, a voltage-controlled oscillation circuit 12, and a buffer 18 all connected in series in this order, and further has a regulator (a constant voltage output circuit) 26 for supplying these constituents and an output circuit 36 described later with a constant voltage (electrical power). Further, a switch circuit 24 is connected between the regulator 26 and the temperature compensation circuit 22. Further, there is provided the output circuit 36 for outputting a first ON/OFF signal (SW1) to the switch circuit 24, and outputting a second ON/OFF signal (SW2) to the sample-and-hold circuit 28. It should be noted that, as described later, the ON/OFF signals denote switching control signals for continuously and repeatedly performing switching between connection and disconnection between input and output terminals of the switch circuit 24, and switching between connection and disconnection between input and output terminals of the sample-and-hold circuit 28, respectively.

Figure 2:
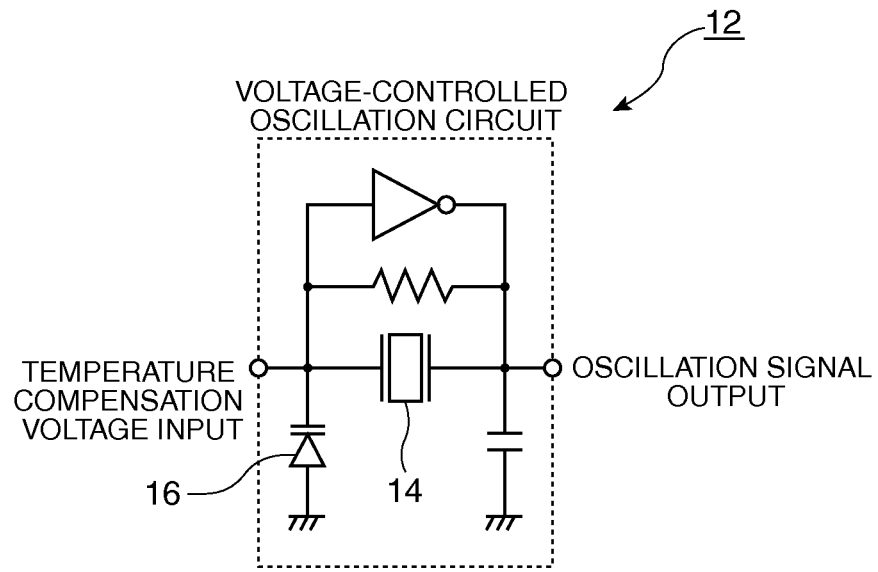
FIG. 2 is a circuit diagram of a voltage-controlled oscillation circuit according to the first embodiment.

FIG. 2 shows a circuit diagram of the voltage-controlled oscillation circuit 12 according to the first embodiment. The voltage-controlled oscillation circuit 12 is, for example, a Colpitts oscillation circuit, and has a piezoelectric vibrator 14 as an oscillation source. As the piezoelectric vibrator 14, for example, a thickness-shear vibrator and a tuning-fork vibrator each formed of a quartz crystal can be used. Further, by applying an alternating-current voltage to the piezoelectric vibrator 14, the oscillation signal can be output at a predetermined resonant frequency.

Further, the voltage-controlled oscillation circuit 12 incorporates a varactor diode 16 having a variable capacitance. In the voltage-controlled oscillation circuit 12, by varying the voltage (the temperature compensation voltage) applied to the varactor diode 16, the capacitance of the varactor diode 16 varies, and the oscillation frequency of the oscillation signal varies due to the capacitance variation. It should be noted that the buffer 18 is a circuit having an extremely high input impedance, and is capable of transmitting only the voltage of the oscillation signal, which is output from the voltage-controlled oscillation circuit 12, to a destination device connected thereto. Thus, the voltage-controlled oscillation circuit 12 can output the oscillation signal without being affected by the destination device connected thereto.

Since the resonant frequency of the piezoelectric vibrator 14 varies due to the temperature variation, the oscillation frequency of the oscillation signal reflects the temperature characteristics of the resonant frequency of the piezoelectric vibrator 14, and can vary due to the temperature variation. Therefore, since the temperature compensation voltage for canceling out (suppressing the variation range of the oscillation frequency caused by the influence of the temperature characteristics of the piezoelectric vibrator 14 to a narrow range) the temperature characteristics of the piezoelectric vibrator 14 is applied to the varactor diode 16, the oscillation frequency of the oscillation signal becomes to have temperature characteristics compensated to have a frequency deviation range narrower than that of the temperature characteristics of the piezoelectric vibrator 14 with respect to the temperature variation.

As shown in FIG. 1, the temperature sensor 20 is for outputting the voltage corresponding to the temperature measured to the temperature compensation circuit 22, and is formed of a diode or the like. In the case of forming the temperature sensor 20 of a diode, a forward current is applied to the diode, and then the amount of the voltage drop varying with the temperature is output to the temperature compensation circuit 22.

The voltage as the temperature information is input from the temperature sensor 20 to the temperature compensation circuit 22, and then the temperature compensation circuit 22 outputs the temperature compensation voltage corresponding to the voltage to the sample-and-hold circuit 28. If the piezoelectric vibrator 14 of the present embodiment is a tuning-fork vibrator, the temperature characteristics of the resonant frequency thereof can be drawn as a curve shaped like a quadratic curve, and if the piezoelectric vibrator 14 is a thickness-shear vibrator, the temperature characteristics thereof can be drawn as a curve shaped like a cubic curve. Therefore, the information of the temperature coefficients such as zero-order, first-order, second-order, and third-order temperature coefficients for approximating the temperature characteristics of the resonant frequency of the piezoelectric vibrator 14 is previously input to the temperature compensation circuit 22. Therefore, the temperature compensation circuit 22 calculates the power series taking these temperature coefficients as the coefficients using the temperature information as a variable to thereby calculate the temperature compensation voltage based on the information of the resonant frequency of the piezoelectric vibrator 14 at the temperature thus measured, and then output the temperature compensation voltage to the sample-and-hold circuit 28.

The switch circuit 24 is connected between the regulator 26 and the temperature compensation circuit 22, and performs ON/OFF control of the power, which the temperature compensation circuit 22 receives from the regulator 26. The switch circuit 24 performs the ON/OFF control of the temperature compensation circuit 22 in accordance with the first ON/OFF signal (SW1) input from the output circuit 36, wherein the temperature compensation circuit 22 is set to an ON state (a conduction state) if the voltage of the first ON/OFF signal (SW1) is H (a voltage higher than a reference value), and the temperature compensation circuit 22 is set to an OFF state (a non-conduction state) if the voltage of the first ON/OFF signal (SW1) is L (a voltage lower than the reference value).

Figure 3:
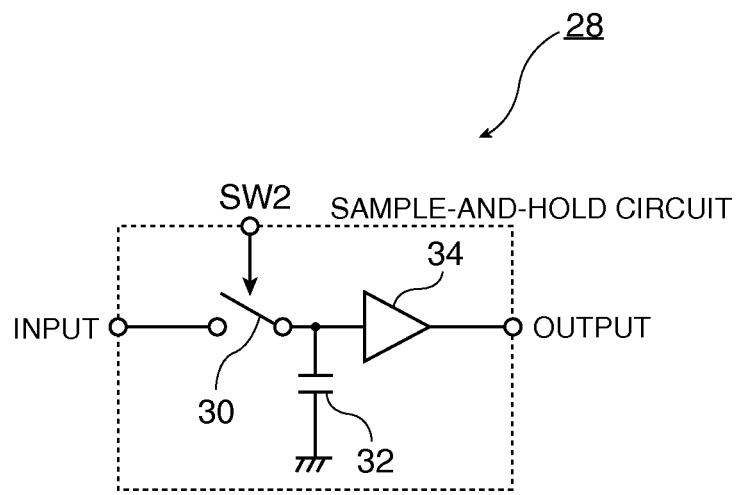
FIG. 3 is a circuit diagram of a sample-and-hold circuit according to the first embodiment.

FIG. 3 shows a circuit diagram of a sample-and-hold circuit according to the first embodiment. The sample-and-hold circuit 28 performs the control of switching between a state (a direct output state) of outputting the temperature compensation voltage to the voltage-controlled oscillation circuit 12 while holding the temperature compensation voltage output from the temperature compensation circuit 22, and a sate (a sample-and-hold (S/H) output state) of outputting the temperature compensation voltage thus held to the voltage-controlled oscillation circuit 12 while cutting the connection to the temperature compensation circuit 22.

The sample-and-hold circuit 28 is composed of a switch 30, a capacitor 32, and a buffer 34, and an input end of the buffer 34 is connected to an output side of the switch 30, and the capacitor 32 is connected between the input end of the buffer 34 and the ground. Switching control of the switch 30 is performed in accordance with the second ON/OFF signal (SW2) supplied from the output circuit 36. Specifically, the switch 30 is set to the ON state (the conduction state) if the voltage of the second ON/OFF signal (SW2) is H (the voltage higher than the reference value), and the switch 30 is set to the OFF state (the non-conduction state) if the voltage of the second ON/OFF signal (SW2) is L (the voltage lower than the reference value). Therefore, the sample-and-hold circuit 28 is set to the direct output state if the switch 30 is in the ON state, and is set to the sample-and-hold (S/H) output state if the switch 30 is in the OFF state.

Figure 4:
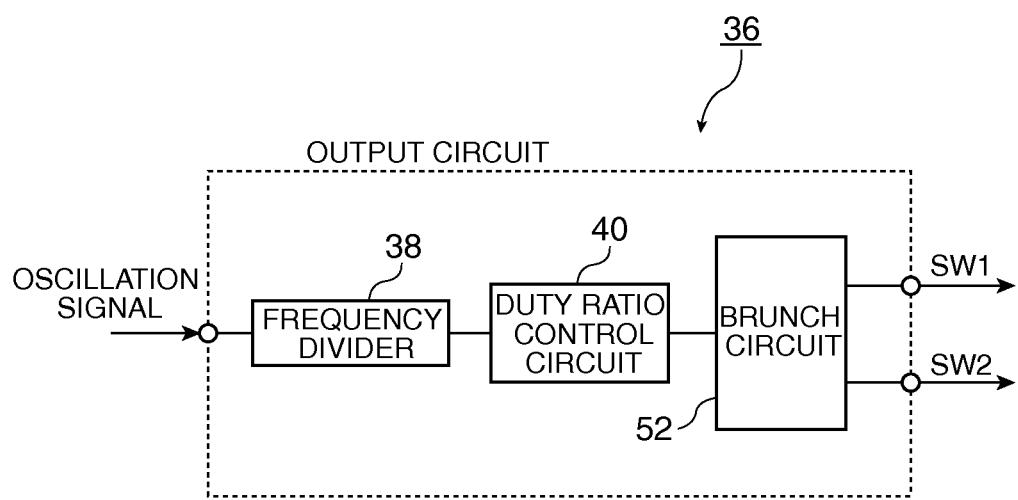
FIG. 4 is a block diagram of an output circuit according to the first embodiment.

FIG. 4 shows a block diagram of the output circuit according to the first embodiment. The output circuit 36 is for generating the first ON/OFF signal (SW1) and the second ON/OFF signal (SW2), and has a frequency divider 38, a duty ratio control circuit 40, and a brunch circuit 52 connected in series in this order. The frequency divider 38 forms an oscillation source for dividing the oscillation signal output from the voltage-controlled oscillation circuit 12 to thereby output a rectangular wave (the ON/OFF signal). Therefore, the period of the rectangular wave output from the frequency divider 38 is used as the period of the temperature compensation of the temperature-compensated oscillator 10 according to the present embodiment. It should be noted that the ratio between the duration time of the voltage H (the ON signal) and the voltage L (the OFF signal) of the rectangular wave output from the frequency divider 38 is assumed to be, for example, roughly one to one.

Figure 5:
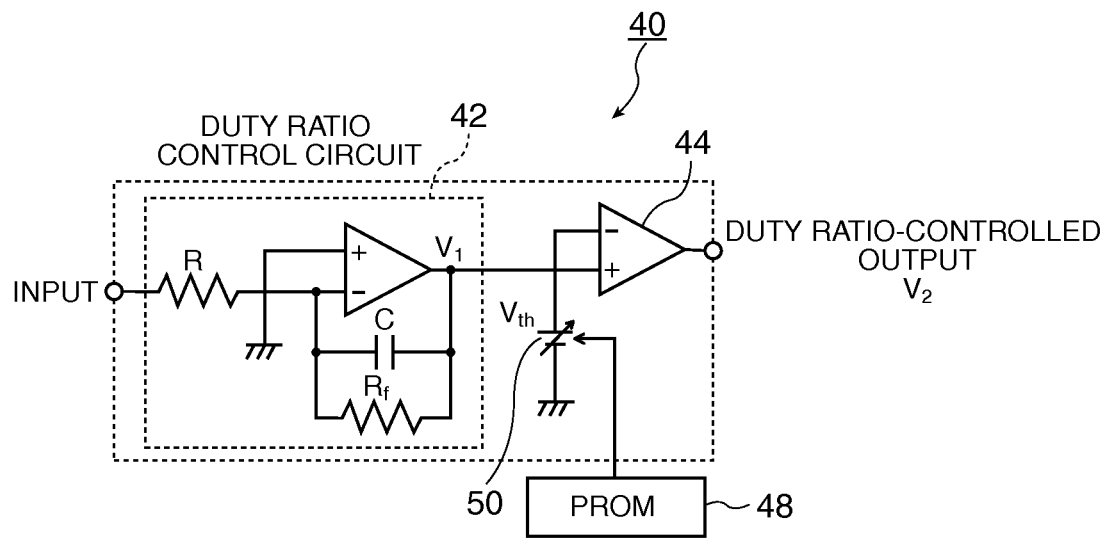
FIG. 5 is a circuit diagram and a time chart of a duty ratio control circuit according to the first embodiment.
Figure 5:
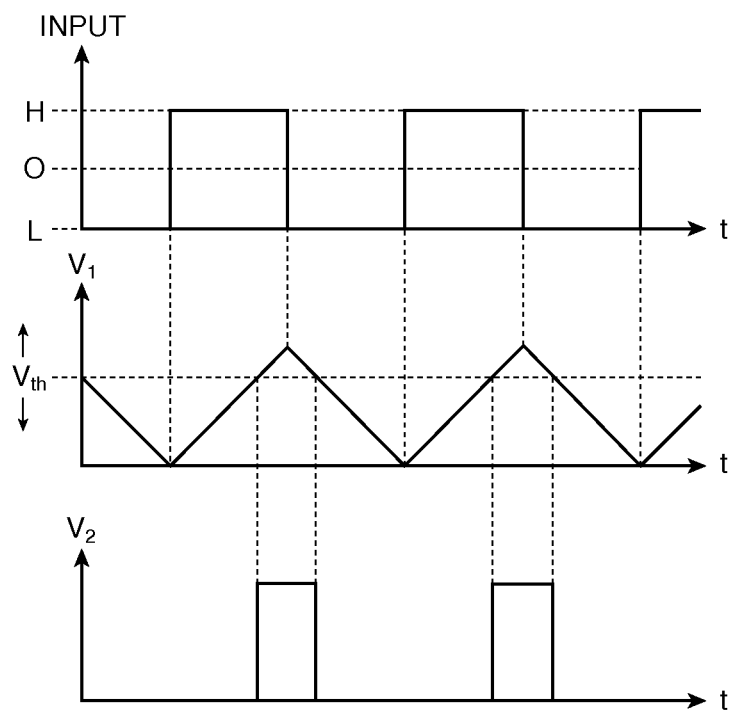

FIG. 5 shows a circuit diagram and a time chart of the duty ratio control circuit according to the first embodiment. The duty ratio control circuit 40 is for controlling the duty ratio of the rectangular wave (the ON/OFF signal) output from the frequency divider 38, and has an integration circuit 42, a comparator 44, and a voltage control section. The integration circuit 42 is for integrating the rectangular wave (the ON/OFF signal) to thereby output a triangular wave (an output $V_1$). Here, it is assumed that the rectangular wave (the ON/OFF signal) is controlled by the frequency divider 38 so as to have a positive voltage in the voltage H, and a negative voltage in the voltage L. Therefore, when the voltage of the rectangular wave reaches H, the output $V_1$ increases with time in a linear function manner, and when the voltage reaches L, the output $V_1$ decreases with time in a linear function manner, and by repeating such a process, the triangular wave $V_1$ is generated.

The comparator 44 is for outputting a signal (the voltage H, the voltage L) representing the magnitude relation between a threshold voltage $V_{th}$ and the output voltage $V_1$ as the ON/OFF signal ($V_2$). The comparator 44 outputs the voltage H if the output voltage $V_1$ is higher than the threshold voltage $V_{th}$, and outputs the voltage L if the output voltage $V_1$ is lower than the threshold voltage $V_{th}$.

The voltage control section is for controlling the threshold voltage $V_{th}$, and is composed of, for example, a programmable read only memory (PROM) 48 and a control power supply 50.

The control power supply 50 sets the threshold voltage $V_{th}$ to a plurality of discrete voltage values in a range from zero to the highest level of the voltage $V_1$, and each of the voltage values is made to correspond to data stored in the PROM 48. Therefore, the control power supply 50 is capable of outputting the threshold voltage $V_{th}$ to be a voltage value corresponding to the data read out from the PROM 48 to the comparator 44. Therefore, the voltage control section is capable of control the threshold voltage $V_{th}$ by changing the data stored in the PROM 48.

Therefore, in the comparator 44 for outputting the signal representing the magnitude relation between the voltage $V_1$ and the threshold voltage $V_{th}$ with time, the higher the threshold voltage $V_{th}$ is set, the shorter the period of outputting the voltage H of the ON/OFF signal ($V_2$) becomes, and the longer the period of outputting the voltage L becomes. In contrast, the lower the threshold voltage $V_{th}$ is set, the longer the period of outputting the voltage H of the ON/OFF signal ($V_2$) becomes, and the shorter the period of outputting the voltage L becomes.

Therefore, in the ON/OFF signal ($V_2$) output from the duty ratio control circuit 40, although the period is equal to that of the original rectangular wave, the phase is reversed, and the duty ratio ((period of voltage H)/((period of voltage H)+ (period of voltage L))) varies. Therefore, the duty ratio of the ON/OFF signal ($V_2$) can be made lower by setting the threshold voltage $V_{th}$ higher, and the duty ratio thereof can be made higher by setting the threshold voltage $V_{th}$ lower.

Therefore, the period of the voltage H of the ON/OFF signal ($V_2$) is controlled by controlling the threshold voltage $V_{th}$ to thereby make the period coincide with the time necessary for the temperature compensation circuit 22 to calculate the temperature compensation voltage, and thus the power consumption in the temperature compensation circuit 22 can be reduced.

It should be noted that in the present embodiment, a Hartley LC oscillation circuit and a Colpitts oscillation circuit (both not shown) can be used as the oscillator source circuit of the ON/OFF signal instead of the frequency divider 38 constituting the output circuit 36. Thus, the ON/OFF signal can be generated independently of the oscillation signal of the voltage-controlled oscillation circuit 12.

In the temperature-compensated oscillator 10 according to the present embodiment, a current of roughly 1 mA is consumed in total. In the current, one third of the total is consumed by the temperature compensation circuit 22, one third is consumed by the voltage-controlled oscillation circuit 12, and one third is consumed by the buffer 18. For example, if the temperature compensation circuit 22 is switched ON/OFF at intervals of 1 ms, the current (the power consumption) of the temperature compensation circuit 22 halves, and as a result of the calculation of (1/3)×(1−(1/2)), roughly 17% of power consumption can be reduced. Further, assuming that the duty ratio of switching ON/OFF of the temperature compensation circuit 22 indicates that the proportion of the ON period is 20% and the proportion of the OFF period is 80%, as a result of the calculation of (1/3)×(1−20%/(20%+80%)), roughly 27% of power consumption can be reduced. It should be noted that in the case of using the LC oscillation circuit described above in the output circuit 36, the total power consumption of the temperature-compensated oscillator 10 is not affected since the current used is in a degree of several tens of microamperes, although the power consumption increases.

Incidentally, in the temperature-compensated oscillator 10 according to the present embodiment, the temperature compensation circuit 22 needs a certain period of time from when the power is supplied via the switch circuit 24 to when the temperature compensation voltage is stably output. Therefore, if the switch 30 inside the sample-and-hold circuit 28 is connected in a condition in which the temperature compensation voltage is unstable, there might be the case in which an unstable temperature compensation voltage is output to the voltage-controlled oscillation circuit 12, and the oscillation signal is made unstable.

Further, if the output of the temperature compensation voltage from the temperature compensation circuit 22 stops in the state in which the switch 30 inside the sample-and-hold circuit 28 is in a connected state, the capacitor 32 inside the sample-and-hold circuit 28 is discharged, and therefore, it becomes difficult to hold an accurate temperature compensation voltage. Therefore, in the present embodiment, it is preferable that the switch 30 of the sample-and-hold circuit 28 is set to the connected state after a certain period of time has elapsed from the start-up of the temperature compensation circuit 22, and the power supply to the temperature compensation circuit 22 is stopped after the switch 30 inside the sample-and-hold circuit 28 is set to a disconnected state.

Therefore, in the present embodiment, in order to make it possible to perform the connection and the disconnection in the order described above, a time lag is provided between the first ON/OFF signal (SW1) output to the switch circuit 24 and the second ON/OFF signal (SW2) output to the sample-and-hold circuit 28 using the branch circuit 52 explained below.

In other words, the time lag is provided between the timing of generating the ON signal of the first ON/OFF signal (SW1) and the timing of generating the ON signal of the second ON/OFF signal (SW2), and the time lag is also provided between the timing of generating the OFF signal of the first ON/OFF signal (SW1) and the timing of generating the OFF signal of the second ON/OFF signal (SW2).

Figure 6:
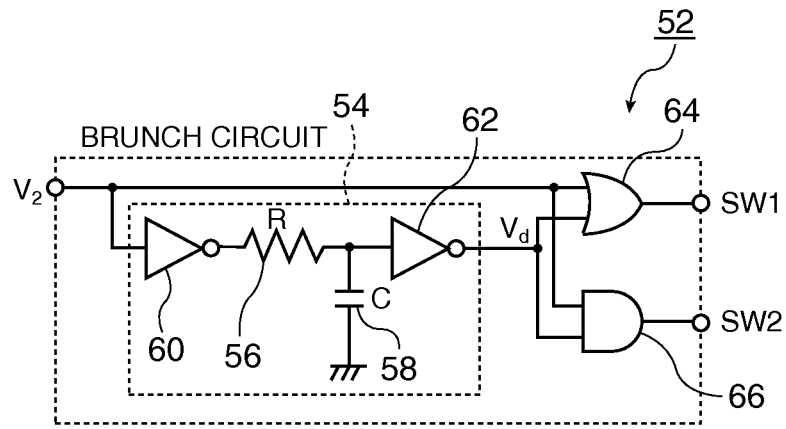
FIG. 6 is a circuit diagram and a time chart of a brunch circuit according to the first embodiment.
Figure 6:
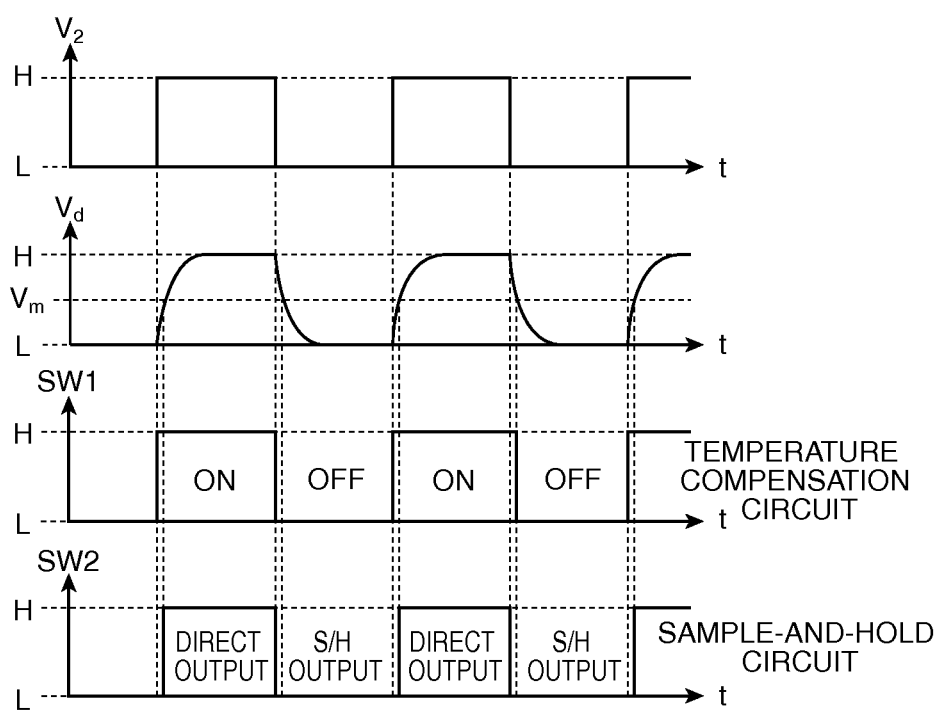

FIG. 6 shows a circuit diagram and a time chart of the brunch circuit according to the first embodiment. As shown in FIG. 6, the brunch circuit 52 is mainly composed of a delay circuit 54, an OR circuit 64, and an AND circuit 66. The delay circuit 54 is obtained by connecting buffers 60, 62 respectively to an input side and an output side of a low-pass filter composed of a resistor 56 (R) and a capacitor 58 (C) as an inverter circuit. Here, when the ON/OFF signal ($V_2$) output from the comparator 44 is in the voltage L, the output of the buffer 60 is in the voltage H, and the capacitor 58 is charged, and the output of the buffer 62, namely a delay signal ($V_d$) is set to the voltage L. Further, when the signal $V_2$ is in the voltage H, the output of the buffer 60 is set to the voltage L, and the capacitor 58 is discharged, and the output of the buffer 62, namely the delay signal ($V_d$) is set to the voltage H.

Then, when the signal $V_2$ rises from the voltage L to the voltage H, the capacitor 58 is discharged in accordance with time constant corresponding to the capacitance of the capacitor 58, and the voltage applied to the capacitor 58 converges to a low voltage (zero) with time. Thus, the delay signal ($V_d$) rises from the voltage L and converges to the voltage H with a predetermined time delay. Further, when the signal $V_2$ falls from the voltage H to the voltage L, the capacitor 58 is charged based on the time constant described above, and the voltage applied to the capacitor 58 converges to a predetermined voltage. Thus, the delay signal ($V_d$) falls from the voltage H and converges to the voltage L with a predetermined time delay.

The OR circuit 64 is for outputting a signal representing the OR result between the ON/OFF signal ($V_2$) and the delay signal ($V_d$) to the switch circuit 24 as the first ON/OFF signal (SW1). It is assumed that the OR circuit 64 recognizes the voltage L of the ON/OFF signal ($V_2$) as the voltage L, and recognizes the voltage H of the ON/OFF signal ($V_2$) as the voltage H. On the other hand, the OR circuit 64 is adjusted so as to recognize the voltage of the delay signal ($V_d$) as the voltage H if the voltage of the delay signal ($V_d$) exceeds the voltage $V_m$ between the voltage H and the voltage L of the delay signal ($V_d$), for example, the voltage $V_m$ corresponding to ((voltage H)+(voltage L))/2, and to recognize the voltage of the delay signal ($V_d$) as the voltage L if the voltage of the delay signal ($V_d$) becomes lower than the voltage $V_m$.

The OR circuit 64 outputs the first ON/OFF signal (SW1) with the voltage H if it recognizes the voltage of either one of the ON/OFF signal ($V_2$) and the delay signal ($V_d$) as the voltage H. Therefore, if the ON/OFF signal ($V_2$) rises from the voltage L to the voltage H, since the OR circuit 64 recognizes the voltage of the ON/OFF signal ($V_2$) as the voltage H at the same time as the ON/OFF signal ($V_2$) rises to the voltage H, the first ON/OFF signal (SW1) with the voltage H can be output.

On the other hand, if the ON/OFF signal ($V_2$) falls from the voltage H to the voltage L, the OR circuit 64 recognizes the voltage of the ON/OFF signal ($V_2$) as the voltage L at the same time as the ON/OFF signal ($V_2$) falls to the voltage L. However, the OR circuit 64 recognizes the voltage of the delay signal ($V_d$) as the voltage H until the voltage of the delay signal ($V_d$) becomes equal to or lower than the voltage $V_m$, and therefore, continuously outputs the first ON/OFF signal (SW1) with the voltage H. Then, the OR circuit 64 recognizes the voltage of the delay signal ($V_d$) as the voltage L after the voltage of the delay signal ($V_d$) becomes equal to or lower than the voltage $V_m$, and thus can output the first ON/OFF signal (SW1) with the voltage L.

The AND circuit 66 is for outputting a signal representing the AND result between the ON/OFF signal ($V_2$) and the delay signal ($V_d$) to the sample-and-hold circuit 28 as the second ON/OFF signal (SW2). It is assumed that the AND circuit 66 recognizes the voltage L of the ON/OFF signal ($V_2$) as the voltage L, and recognizes the voltage H of the ON/OFF signal ($V_2$) as the voltage H. On the other hand, the AND circuit 66 is adjusted so as to recognize the voltage of the delay signal ($V_d$) as the voltage H if the voltage of the delay signal ($V_d$) exceeds the voltage $V_m$ between the voltage H and the voltage L of the delay signal ($V_d$), for example, the voltage $V_m$ corresponding to ((voltage H)+(voltage L))/2, and to recognize the voltage of the delay signal ($V_d$) as the voltage L if the voltage of the delay signal ($V_d$) becomes lower than the voltage $V_m$.

The OR circuit 66 outputs the second ON/OFF signal (SW2) with the voltage H if it recognizes the voltages of both of the ON/OFF signal ($V_2$) and the delay signal ($V_d$) as the voltage H. Therefore, if the ON/OFF signal ($V_2$) rises from the voltage L to the voltage H, the AND circuit 66 recognizes the voltage of the ON/OFF signal ($V_2$) as the voltage H at the same time as the ON/OFF signal ($V_2$) rises to the voltage H. However, the AND circuit 66 recognizes the voltage of the delay signal ($V_d$) as the voltage L until the voltage of the delay signal ($V_d$) becomes equal to or higher than the voltage $V_m$, and therefore outputs the second ON/OFF signal (SW2) with the voltage L. Then, the AND circuit 66 recognizes the voltage of the delay signal ($V_d$) as the voltage H after the voltage of the delay signal ($V_d$) becomes equal to or higher than the voltage $V_m$, and thus can output the second ON/OFF signal (SW2) with the voltage H.

On the other hand, if the ON/OFF signal ($V_2$) falls from the voltage H to the voltage L, the AND circuit 66 recognizes the voltage of the ON/OFF signal ($V_2$) as the voltage L at the same time as the ON/OFF signal ($V_2$) falls to the voltage L, and therefore outputs the second ON/OFF signal (SW2) with the voltage L irrespective of the voltage of the delay signal ($V_d$).

By performing the control described above, it results that in the first ON/OFF signal (SW1) and the second ON/OFF signal (SW2) output from the output circuit 36, the first ON/OFF signal (SW1) rises ahead of the second ON/OFF signal (SW2), and falls in retard of the second ON/OFF signal (SW2). It should be noted that by changing the value of the voltage Vm and the capacitance of the capacitor 58, the time lag in each of the rising edge and the falling edge between the first ON/OFF signal (SW1) and the second ON/OFF signal (SW2) can be controlled.

Therefore, the switch circuit 24 controlled by the first ON/OFF signal (SW1), namely the temperature compensation circuit 22 on which the ON/OFF control is performed by the switch circuit 24, can be set to the ON state a predetermined time earlier than when the sample-and-hold circuit 28 controlled by the second ON/OFF signal (SW2) is set to the direct output state. Further, the temperature compensation circuit 22 can be set to the OFF state after the sample-and-hold circuit 28 is set to the sample-and-hold (S/H) output state. Further, in the present embodiment, since the signals SW1, SW2 are generated by the same oscillation source (the frequency divider 38, or the LC oscillator), the period of switching between the voltage H and the voltage L in the signal SW1 and the period of switching between the voltage H and the voltage L in the signal SW2 coincide with each other. Therefore, it results that the switching control of the sample-and-hold circuit is performed in conjunction with the ON/OFF control of the temperature compensation circuit 22.

Figure 7A:
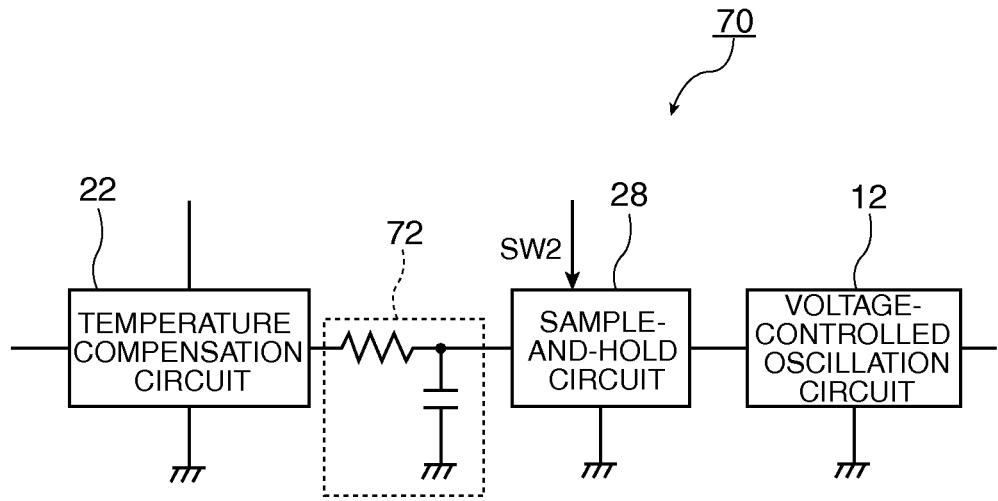
Figure 7B:
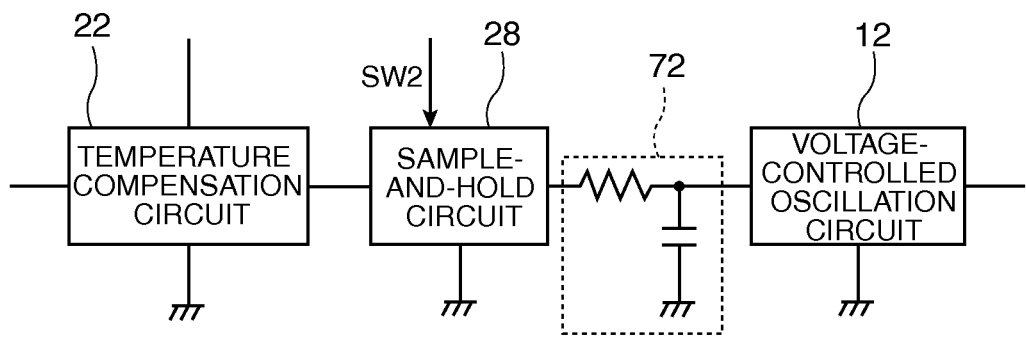

FIGS. 7A and 7B show block diagrams of the temperature-compensated oscillator according to a second embodiment of the invention, wherein FIG. 7A shows a diagram having a low-pass filter disposed between a temperature compensation circuit and a sample-and-hold circuit, and FIG. 7B shows a diagram having a low-pass filter disposed between the sample-and-hold circuit and a voltage-controlled oscillation circuit.

The temperature-compensated oscillator 70 according to the second embodiment has a basic configuration common to the temperature-compensated oscillator according to the first embodiment and the temperature-compensated oscillator according to the second embodiment, but is different therefrom in the point that a low-pass filter 72 is connected at least one of between the temperature compensation circuit 22 and the sample-and-hold circuit 28, and between the sample-and-hold circuit 28 and the voltage-controlled oscillation circuit 12. As the low-pass filter 72, a circuit similar to the circuit included in the delay circuit 54 described above and composed of the resistor 56 and the capacitor 58, for example, can be used. Although the low-pass filter 72 can be applied to either of the configurations shown in FIGS. 7A and 7B, by connecting the low-pass filter 72 in the posterior stage of the sample-and-hold circuit 28 as shown in FIG. 7B, the electrical noise generated in the switching control of the sample-and-hold circuit 28 can be reduced.

Figure 8:
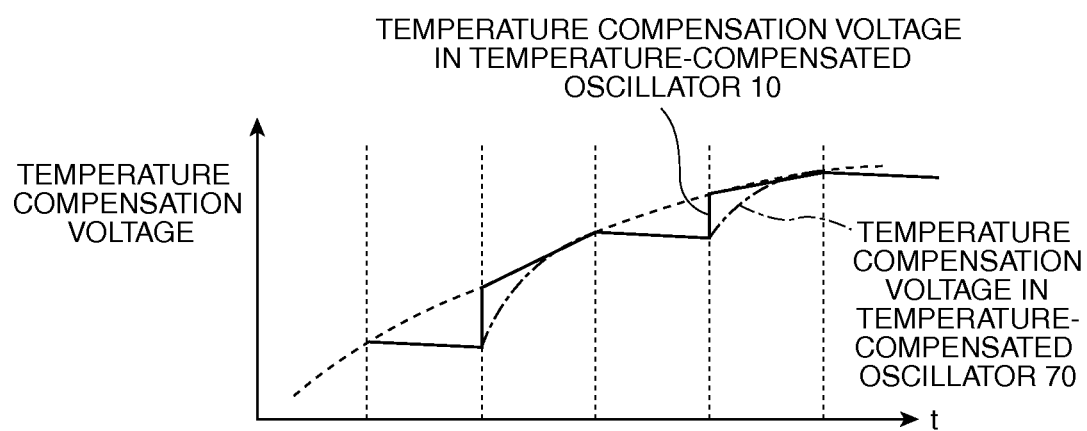
FIG. 8 is a diagram showing time-dependency of temperature compensation voltages of the temperature-compensated oscillator according to the first embodiment and the temperature-compensated oscillator according to the second embodiment.
Figure 9:
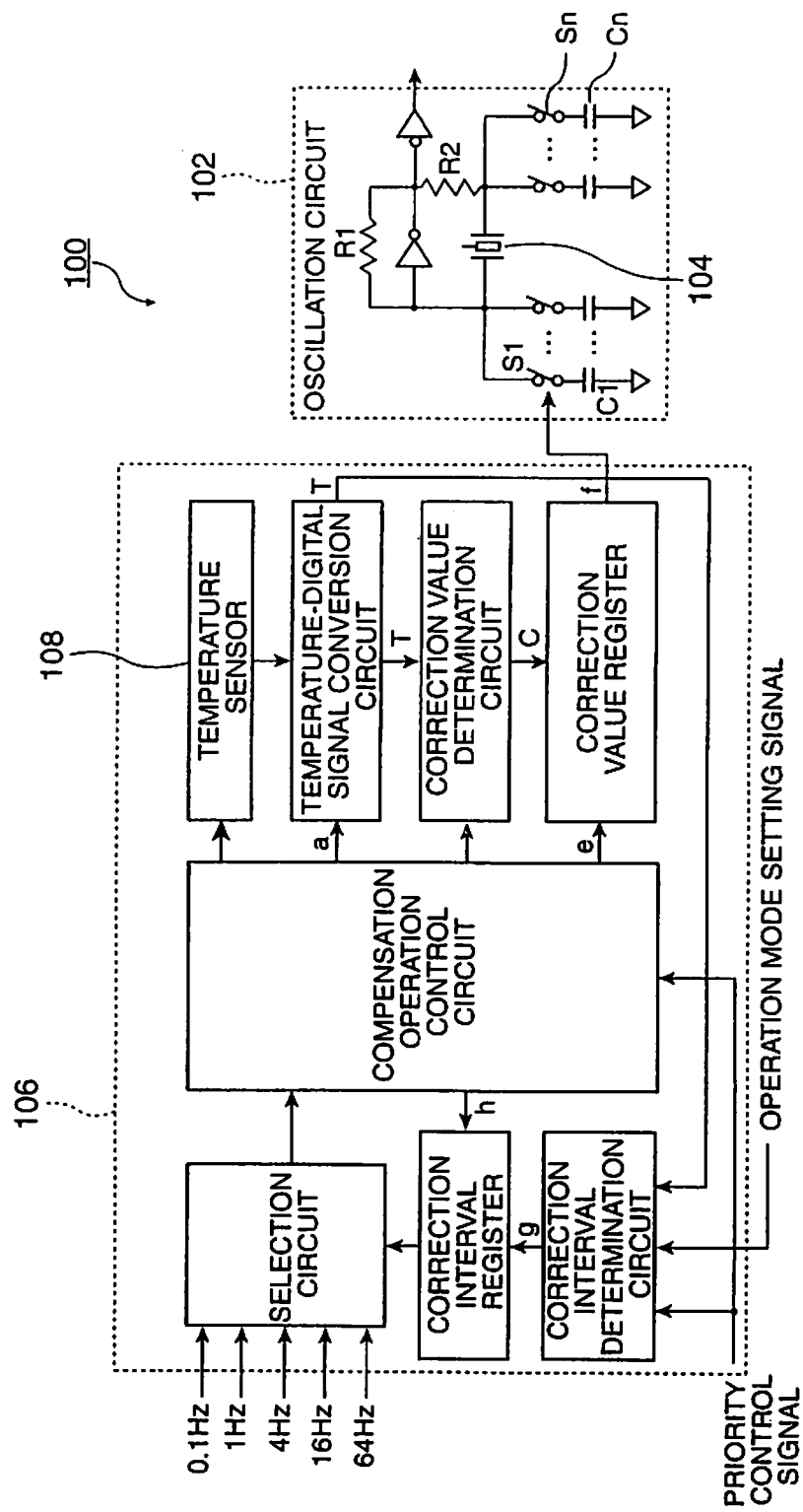
FIG. 9 is a block diagram of the temperature-compensated oscillator described in Patent Document 1.

FIG. 8 shows time-dependency of temperature compensation voltages of the temperature-compensated oscillator according to the first embodiment and the temperature-compensated oscillator according to the second embodiment. In FIG. 8, the case in which the ambient temperature of the temperature-compensated oscillators 10, 70 monotonically rises with time, and therefore, the temperature compensation voltage monotonically rises with time is considered. In the first embodiment, it results that the sample-and-hold circuit 28 switches from the temperature compensation voltage held to the temperature compensation voltage newly input from the temperature compensation circuit 22 immediately after setting the temperature compensation circuit 22 to the ON state. Therefore, the temperature compensation voltage becomes discontinuous in the time direction at the switching, which might exert a harmful influence to the voltage-controlled oscillation circuit 12. Therefore, by disposing the low-pass filter 72 as the temperature-compensated oscillator 70 according to the second embodiment, the time variation in the temperature compensation voltage newly input thereto is made gentle to thereby make it possible to reduce the load on the voltage-controlled oscillation circuit 12. It should be noted that the reason that the temperature compensation voltage drops when the sample-and-hold circuit 28 is in the sample-and-hold (S/H) output state is that the capacitor 32 inside the sample-and-hold circuit 28 is discharged.

It should be noted that in either of the embodiments, if the time period from when the temperature compensation circuit 22 is started up to when the temperature compensation circuit 22 becomes stable is extremely short, and the capacitance of the capacitor 32 of the sample-and-hold circuit 28 is sufficiently large, the brunch circuit 52 described above can be eliminated. Further, if the temperature compensation is performed at the same frequency as the resonant frequency of the voltage-controlled oscillation circuit 12, the frequency divider 38 can be eliminated, and if the duty ratio control of the ON/OFF signal is not necessary, the duty ratio control circuit 40 can also be eliminated. Further, in either of the embodiments, the temperature-compensated oscillator can be installed in a GPS receiver, a cellular phone, and so on, and it is possible to constitute an electronic device allowing reduction of power consumption while keeping the accurate temperature compensation.

The entire disclosure of Japanese Patent Application No. 2011-092444, filed Apr. 18, 2011 is expressly incorporated by reference herein.

What is claimed is:

1. A temperature-compensated oscillator comprising:
a voltage-controlled oscillation circuit;
a temperature compensation circuit adapted to output a temperature compensation voltage used for temperature compensation of an oscillation frequency of the voltage-controlled oscillation circuit;
a switch circuit adapted to perform ON/OFF control on power supply to the temperature compensation circuit;
a sample-and-hold circuit adapted to perform switching control between
an ON state of outputting the temperature compensation voltage output from the temperature compensation circuit to the voltage-controlled oscillation circuit while holding the temperature compensation voltage when the power is supplied to the temperature compensation circuit, and an OFF state of outputting the temperature compensation voltage held to the voltage-controlled oscillation circuit while cutting connection to the temperature compensation circuit when the power supply to the temperature compensation circuit is cut; and an output circuit adapted to output an ON/OFF signal for performing switching control between an ON state and an OFF state of the switch circuit, and output an ON/OFF signal for performing the switching control of the sample-and-hold circuit, the output circuit includes an LC oscillation circuit as an oscillation source circuit of the ON/OFF signals.

2. The temperature-compensated oscillator according to claim 1, wherein,
the output circuit includes
an integration circuit adapted to integrate an oscillation signal from the oscillation source circuit, and
a comparator adapted to output a signal representing a magnitude relation between a voltage of a signal integrated and a threshold voltage to each of the switch circuit side and the sample-and-hold circuit side as the ON/OFF signal.

3. The temperature-compensated oscillator according to claim 2, wherein
the output circuit includes
a voltage control section adapted to control the threshold voltage.

4. The temperature-compensated oscillator according to claim 2, wherein
the output circuit includes
a delay circuit to which an output signal of the comparator is input, and which outputs a delay signal obtained by delaying a voltage variation in the output signal of the comparator,
an OR circuit adapted to output a signal representing an OR result between the ON/OFF signal and the delay signal to the switch circuit as the ON/OFF signal, and
an AND circuit adapted to output a signal representing an AND result between the output signal of the comparator and the delay signal to the sample-and-circuit as the ON/OFF signal.

5. The temperature-compensated oscillator according to claim 1, further comprising:
a low-pass filter disposed at least one of
between the temperature compensation circuit and the sample-and-hold circuit, and
between the sample-and-hold circuit and the voltage-controlled oscillation circuit.

6. An electronic device comprising:
the temperature-compensated oscillator according to claim 1.

7. A temperature-compensated oscillator comprising:
a voltage-controlled oscillation circuit;
a temperature compensation circuit adapted to output a temperature compensation voltage used for temperature compensation of an oscillation frequency of the voltage-controlled oscillation circuit;
a switch circuit adapted to perform ON/OFF control on power supply to the temperature compensation circuit;
a sample-and-hold circuit adapted to perform switching control between
an ON state of outputting the temperature compensation voltage output from the temperature compensation circuit to the voltage-controlled oscillation circuit while holding the temperature compensation voltage when the power is supplied to the temperature compensation circuit, and
an OFF state of outputting the temperature compensation voltage held to the voltage-controlled oscillation circuit while cutting connection to the temperature compensation circuit when the power supply to the temperature compensation circuit is cut; and wherein
an oscillation source circuit of the ON/OFF signal of the output circuit is the voltage-controlled oscillation circuit.

8. An electronic device comprising:
the temperature-compensated oscillator according to claim 7.

* * * * *